US010768507B2

(12) United States Patent
Fujimoto et al.

(10) Patent No.: US 10,768,507 B2
(45) Date of Patent: Sep. 8, 2020

(54) VIBRATION DEVICE AND IMAGING DEVICE

(71) Applicant: Murata Manufacturing Co., Ltd., Nagaokakyo-shi, Kyoto-fu (JP)

(72) Inventors: Katsumi Fujimoto, Nagaokakyo (JP); Kenji Nishiyama, Nagaokakyo (JP); Masanobu Nomura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 211 days.

(21) Appl. No.: 16/147,910

(22) Filed: Oct. 1, 2018

(65) Prior Publication Data
US 2019/0033685 A1    Jan. 31, 2019

Related U.S. Application Data

(63) Continuation of application No. PCT/JP2017/019382, filed on May 24, 2017.

(30) Foreign Application Priority Data

Jun. 24, 2016  (JP) .................. 2016-125469

(51) Int. Cl.
*G02B 27/00*        (2006.01)
*G03B 5/00*         (2006.01)
(Continued)

(52) U.S. Cl.
CPC .............. *G03B 5/00* (2013.01); *B06B 1/0284* (2013.01); *B06B 1/0644* (2013.01);
(Continued)

(58) Field of Classification Search
CPC ....... G03B 5/00; G03B 17/08; H01L 41/0986; H02N 2/002; B06B 1/0644; G02B 27/0006
(Continued)

(56) References Cited

U.S. PATENT DOCUMENTS 10,156,719 B2 * 12/2018 Fujimoto .............. G03B 17/02
10,268,039 B2 *  4/2019 Nishiyama ......... G02B 27/0006
(Continued)

FOREIGN PATENT DOCUMENTS

JP    2007-082062 A    3/2007
JP    2010-161639 A    7/2010
(Continued)

OTHER PUBLICATIONS

Official Communication issued in International Patent Application No. PCT/JP2017/019382, dated Aug. 22, 2017.

*Primary Examiner* — Ricky D Shafer
(74) *Attorney, Agent, or Firm* — Keating & Bennett, LLP

(57) ABSTRACT

A vibration device includes a vibration body including a light-transmitting portion including first and second main surfaces opposing each other and a vibration portion that is continuous with the light-transmitting portion and vibrates with a main vibration together with the light-transmitting portion, and a piezoelectric vibrator fixed to the vibration portion. Localized vibration portions which generate a localized vibration different from the main vibration are provided at a position not overlapping with a center or approximate center of the light-transmitting portion.

20 Claims, 13 Drawing Sheets

(51) Int. Cl.
*G03B 17/08* (2006.01)
*H01L 41/09* (2006.01)
*B06B 1/06* (2006.01)
*H04N 5/225* (2006.01)
*B06B 1/02* (2006.01)
*H02N 2/00* (2006.01)
*B60S 1/56* (2006.01)

(52) U.S. Cl.
CPC ......... *G02B 27/0006* (2013.01); *G03B 17/08* (2013.01); *H01L 41/0986* (2013.01); *H02N 2/002* (2013.01); *H04N 5/2254* (2013.01); *B06B 2201/70* (2013.01); *B60S 1/56* (2013.01); *G03B 2205/0061* (2013.01)

(58) Field of Classification Search
USPC ..................... 359/507; 310/335, 369; 396/25
See application file for complete search history.

(56) References Cited

U.S. PATENT DOCUMENTS

| | | | |
|---|---|---|---|
| 10,444,495 B2 * | 10/2019 | Fujimoto | H04N 5/22521 |
| 2016/0266379 A1 * | 9/2016 | Li | H04N 5/2171 |
| 2018/0031826 A1 * | 2/2018 | Fedigan | G02B 3/0075 |
| 2018/0239218 A1 * | 8/2018 | Ikeuchi | G03B 5/00 |
| 2019/0151897 A1 * | 5/2019 | Fujimoto | H04N 5/225 |
| 2020/0039475 A1 * | 2/2020 | Ichiguchi | B60S 1/56 |
| 2020/0055087 A1 * | 2/2020 | Fujimoto | H01L 41/053 |
| 2020/0144939 A1 * | 5/2020 | Fujimoto | H04N 7/18 |

FOREIGN PATENT DOCUMENTS

| | | |
|---|---|---|
| JP | 2011-125815 A | 6/2011 |
| JP | 2012-138768 A | 7/2012 |

* cited by examiner

VIBRATION DEVICE AND IMAGING DEVICE

CROSS REFERENCE TO RELATED APPLICATIONS

This application claims the benefit of priority to Japanese Patent Application No. 2016-125469 filed on Jun. 24, 2016 and is a Continuation Application of PCT Application No. PCT/JP2017/019382 filed on May 24, 2017. The entire contents of each application are hereby incorporated herein by reference.

BACKGROUND OF THE INVENTION

1. Field of the Invention

The present invention relates to a vibration device that vibrates a vibration body including a light-transmitting portion, and an imaging device including the vibration device.

2. Description of the Related Art

Existing cameras have been proposed which have a water droplet removing function, such as raindrops or the like. In Japanese Unexamined Patent Application Publication No. 2012-138768, a dome-shaped cover is disposed in front of a camera main body. A cylindrical portion is connected to the dome-shaped cover. A piezoelectric vibrator is fixed to the cylindrical portion. The piezoelectric vibrator is caused to vibrate when water droplets adhere to the dome-shaped cover. With this configuration, the cylindrical portion and the dome-shaped cover are vibrated, and the water droplets are removed from the dome-shaped cover.

On the other hand, in Japanese Unexamined Patent Application Publication No. 2007-82062, an ultrasonic transducer, an adhesive layer portion, and an external lens are disposed in front of a camera. When water droplets adhere to the external lens, an alternating current signal voltage is applied to the ultrasonic transducer. With this, the ultrasonic transducer is vibrated, and the external lens connected to the ultrasonic transducer is vibrated. As a result, the water droplets adhering to the external lens are removed.

In the cameras including the water droplet removing functions disclosed in Japanese Unexamined Patent Application Publication No. 2012-138768 and Japanese Unexamined Patent Application Publication No. 2007-82062, in order to reliably remove the water droplets or the like, it is necessary to strongly vibrate the dome-shaped cover or the external lens. However, since the materials and shapes of the dome-shaped cover, the external lens, or the like vary, it is difficult to reliably remove the water droplets adhering thereto. In addition, when a mixture of water and soil, such as mud, adheres, it may not be reliably removed.

SUMMARY OF THE INVENTION

Preferred embodiments of the present invention provide vibration devices each capable of easily moving and atomizing water droplets or other substances adhered to a light-transmitting portion of a vibration body, and imaging devices including the vibration devices.

A vibration device according to a preferred embodiment of the present invention includes a vibration body including a light-transmitting portion including first and second main surfaces opposing each other and a vibration portion which is continuous with the light-transmitting portion and vibrates with a main vibration together with the light-transmitting portion; and a piezoelectric vibrator fixed to the vibration portion, in which a plurality of localized vibration portions which generate a localized vibration different from the main vibration are provided at a position not overlapping with a center or approximate center of the light-transmitting portion.

In a vibration device according to a preferred embodiment the present invention, the piezoelectric vibrator is fixed to the vibration portion of the vibration body such that the main vibration and the localized vibration are excited.

In a vibration device according to a preferred embodiment of the present invention, the localized vibration portion is provided in the light-transmitting portion and is different in at least one of a Young's modulus, a density, and a Poisson's ratio from a remaining portion of the light-transmitting portion. In this case, it is possible to easily provide the localized vibration portion only by configuring the localized vibration portion to be different in at least one of the Young's modulus, the density, and the Poisson's ratio from the remaining portion.

In a vibration device according to a preferred embodiment the present invention, the localized vibration portion is provided in the light-transmitting portion and is a thin portion having a thickness smaller than a thickness of the remaining portion of the light-transmitting portion. In this case, the localized vibration portion is able to be provided only by providing the portion having a small thickness in the light-transmitting portion.

In a vibration device according to a preferred embodiment the present invention, at least one of the first and second main surfaces of the light-transmitting portion is provided with a recessed portion in the thin portion. In this case, the localized vibration portion is able to be provided only by providing the recessed portion on at least one of the first and second main surfaces.

In a vibration device according to a preferred embodiment the present invention, the recessed portion is provided on the first main surface. In this case, by positioning the second main surface in an outer side portion, it is possible to easily atomize water droplets or other substances adhered to the second main surface not provided with the recessed portion.

In a vibration device according to a preferred embodiment the present invention, the localized vibration portion is made of a material different from a material of the remaining portion of the light-transmitting portion. In this case, it is possible to provide the localized vibration portion by merely providing a portion made of the different material.

In a vibration device according to a preferred embodiment the present invention, the localized vibration portion is provided in the vibration portion.

In a vibration device according to a preferred embodiment the present invention, a planar shape of the localized vibration portion is circular or substantially circular. In this case, the localized vibration is not substantially dispersed. Thus, the amplitude of the localized vibration is able to be increased.

In a vibration device according to a preferred embodiment the present invention, the number of the localized vibration portions is an even number. In this case, two sets of the localized vibration portions which vibrate in opposite phases are able to be provided.

In a vibration device according to a preferred embodiment the present invention, the vibration body includes a tubular main body and a lid portion that closes an opening of the tubular main body, and the light-transmitting portion is provided in the lid portion.

In a vibration device according to a preferred embodiment the present invention, the vibration body has a rectangular or substantially rectangular plate shape.

In a vibration device according to a preferred embodiment of the present invention, a driving circuit that drives the piezoelectric vibrator is further included.

In a vibration device according to a preferred embodiment the present invention, a driving frequency changer that changes a frequency of a driving signal of the piezoelectric vibrator is further included. In this case, it is possible to effectively excite the piezoelectric vibrator with a main vibration mode and a localized vibration mode by changing the frequency of the driving signal.

An imaging device according to a preferred embodiment of the present invention includes a vibration device according to a preferred embodiment of the present invention, and an imaging element provided so as to oppose the first main surface in order to shoot an outside of the second main surface of the vibration body of the vibration device. In this case, the water droplets or other substances adhered to the second main surface are able to be easily moved and atomized in the light-transmitting portion.

In an imaging device according to a preferred embodiment of the present invention, the localized vibration portion is positioned outside a field of view of the imaging element. In this case, in the field of view of the imaging element, the water droplets or other substances adhered to the light-transmitting portion are able to be easily moved outside the field of view and removed.

With vibration devices and imaging devices including the vibration devices according to preferred embodiments of the present invention, water droplets or other substances adhered to a light-transmitting portion are able to be easily moved and atomized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings.

It should be noted that each of the preferred embodiments described in the present specification is exemplary and it is to be understood that a partial replacement or combination of configurations is also possible among different preferred embodiments.

Figure 1:
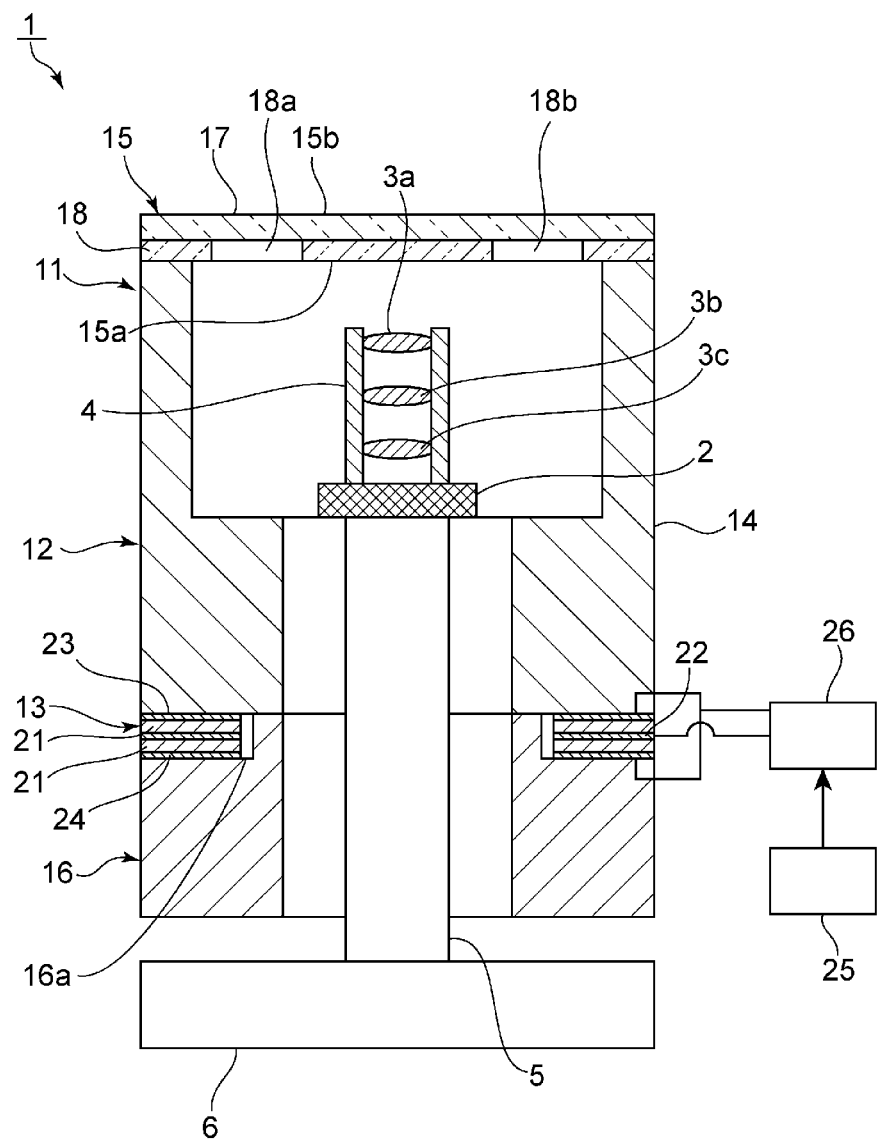
FIG. 1 is a front cross-sectional view of an imaging device according to a first preferred embodiment of the present invention.

FIG. 1 is a front cross-sectional view of an imaging device according to a first preferred embodiment of the present invention.

An imaging device 1 includes an imaging element 2. As the imaging element 2, an existing general imaging element used to convert an image into an electric signal may be widely used. In front of the imaging element 2, a lens housing body 4 houses a plurality of lenses 3a to 3c. The imaging element 2 is supported by a support portion 5. A lower end of the support portion 5 is connected to a base plate 6.

The imaging element 2 and the lens housing body 4 are disposed in a vibration device 11 according to the first preferred embodiment. The vibration device 11 includes a vibration body 12 and a piezoelectric vibrator 13.

In the present preferred embodiment, the vibration body 12 includes a tubular main body 14 preferably having, for example, a cylindrical or substantially cylindrical shape as an excitation portion and a lid portion 15 which closes an opening in an upper area of the tubular main body 14.

Figure 2:
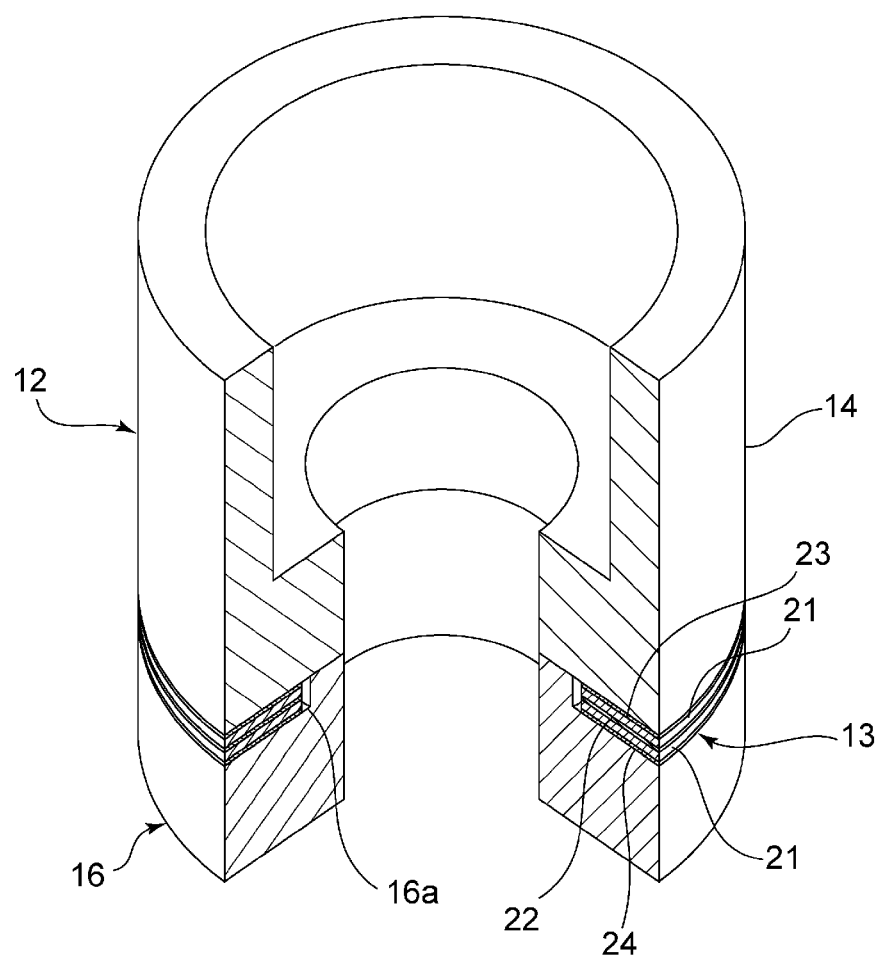
FIG. 2 is a partially cut-out perspective view for explaining a tubular main body and a piezoelectric vibrator fixed to the tubular main body in a vibration device according to the first preferred embodiment of the present invention.

FIG. 2 is a partially cut-out perspective view illustrating a structure in which the tubular main body 14, the piezoelectric vibrator 13, and a support portion 16 are laminated. The piezoelectric vibrator 13 is fixed to a lower surface of the tubular main body 14. More specifically, a doughnut-shaped recessed portion 16a is provided on an upper surface of the support portion 16 preferably having, for example, a cylindrical or substantially cylindrical shape. The piezoelectric vibrator 13 is provided in the recessed portion 16a. The piezoelectric vibrator 13 is sandwiched and fixed between the support portion 16 and the tubular main body 14.

The lid portion 15 preferably has a disk shape, for example. As illustrated in FIG. 1, the lid portion 15 includes first and second main surfaces 15a and 15b that oppose each other. In the present preferred embodiment, the lid portion 15 is preferably made of, for example, transparent synthetic resin. Other light-transmitting materials such as transparent glass or the like may also be used.

In the present preferred embodiment, the entire lid portion 15 is preferably a light-transmitting portion. However, the central region of the lid portion may be a light-transmitting portion, and an outer side portion of the light-transmitting portion may be a portion that does not transmit light.

Of the first and second main surfaces 15a and 15b that oppose each other, the first main surface 15a opposes the lens housing body 4. Thus, an outer side portion of the second main surface 15b may be shot by a camera including the imaging element 2.

Note that the imaging element is not particularly limited, and a CCD, a CMOS radar (RADAR), a LIDER, or other suitable imaging element, for example, may be used.

Figure 3:
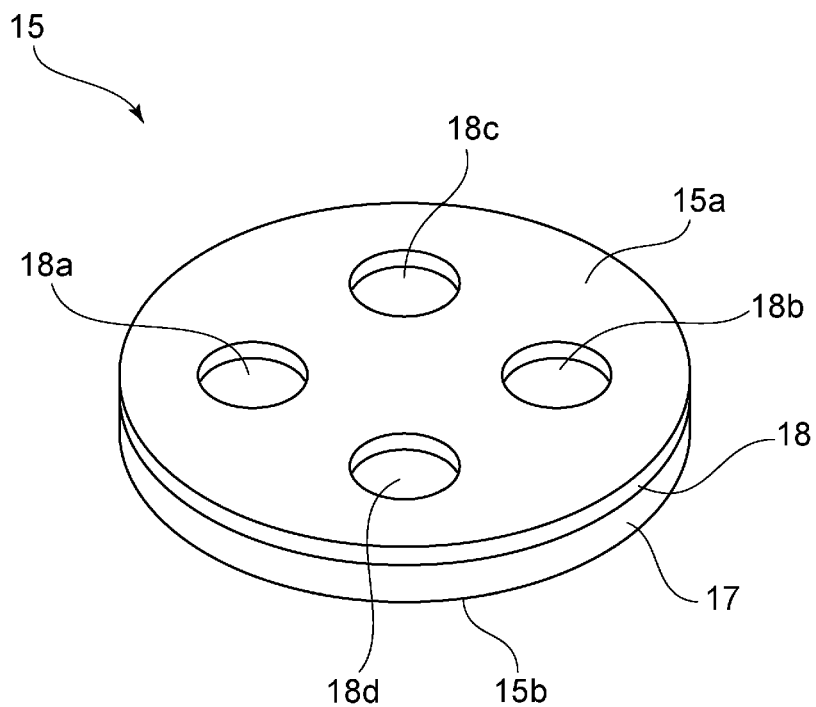
FIG. 3 is a perspective view of a lid portion in which a localized vibration portion is provided in the vibration device according to the first preferred embodiment of the present invention when viewed from a first main surface side.

Further, in the present preferred embodiment, the lid portion 15 includes a transparent first disk-shaped plate 17 and a second disk-shaped plate 18 bonded to the first disk-shaped plate 17. The first disk-shaped plate 17 and the second disk-shaped plate 18 are preferably made of, for example, a transparent glass material or transparent synthetic resin. Further, a plurality of through-holes is provided in the second disk-shaped plate 18. As a result, the lid portion 15 is provided with recessed portions 18a and 18b which are open on a lower surface side, that is, on a side of the first main surface 15a. FIG. 3 is a perspective view of the lid portion 15 seen from the side of the first main surface 15a. The lid portion 15 preferably has, for example, a disk shape and includes a plurality of recessed portions 18a to 18d. The recessed portions 18c and 18d are also defined by providing through-holes in the second disk-shaped plate 18.

Accordingly, in the lid portion 15, a portion at which the recessed portions 18a to 18d are each provided is a thin portion as compared to the remaining portion. This thin portion causes a localized vibration which will be described later. Therefore, the portion at which the recessed portions 18a to 18d are each provided is a localized vibration portion which generates the localized vibration.

Note that, in the vibration device 11, preferably, the entire lid portion 15 described above is made to be the light-transmitting portion, and the tubular main body 14 defining the excitation portion is continuous with the light-transmitting portion. Both of the lid portion 15 and the tubular main body 14 are able to vibrate.

In the present preferred embodiment, the lid portion 15 is fixed to the tubular main body 14. The fixing structure is not particularly limited. The lid portion 15 may be fixed to the tubular main body 14 using an adhesive, for example. In addition, screws that are screwed to each other may be provided on an outer circumferential surface of the lid portion 15 and an inner circumferential surface of an end portion of the tubular main body 14, respectively. The lid portion 15 and the tubular main body 14 may be integrated by being screwed together. Alternatively, the lid portion 15 and the tubular main body 14 may be integrated of the same material.

The piezoelectric vibrator 13 includes ring-shaped piezoelectric elements 21 and 21. The ring-shaped piezoelectric element 21 and the ring-shaped piezoelectric element 21 are laminated with a ring-shaped metal plate 22 interposed therebetween. The ring-shaped metal plate 22 also defines and functions as a terminal connected to one electric potential. Electrodes 23 and 24 that define the other terminals are provided on outer side surfaces of the ring-shaped piezoelectric elements 21 and 21, respectively, in the lamination direction.

Figure 4:
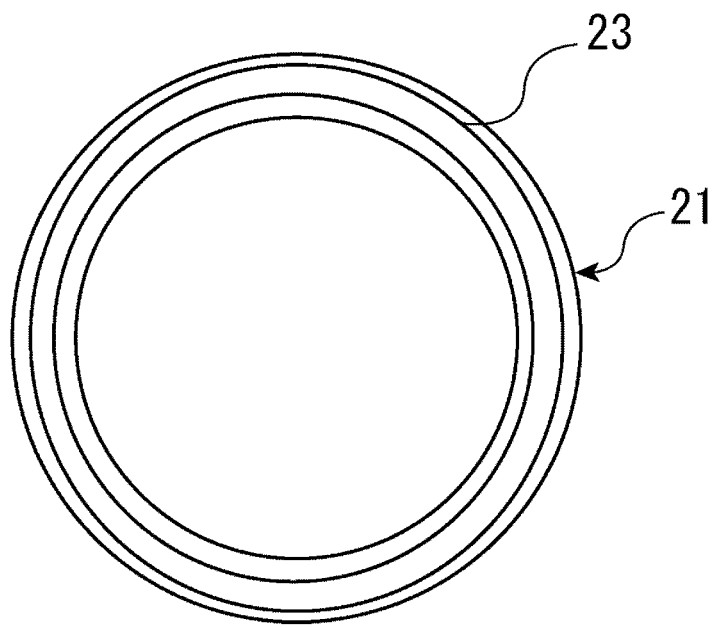
FIG. 4 is a plan view for explaining an electrode provided on the piezoelectric vibrator.

FIG. 4 is a plan view for explaining a shape of the electrode 23. As illustrated in FIG. 4, the electrode 23 having a ring shape is provided on an upper surface of the ring-shaped piezoelectric element 21. Similarly, the electrode 24 illustrated in FIG. 1 also preferably has the ring shape.

The ring-shaped piezoelectric elements 21 and 21 are uniformly subjected to a poling treatment in the thickness direction. However, one ring-shaped piezoelectric element 21 and the other ring-shaped piezoelectric element 21 are subjected to the poling treatment in opposite directions in the thickness direction. A driving signal of an alternating current signal is applied to the piezoelectric vibrator 13. As a result, the piezoelectric vibrator 13 expands and contracts, thus causing a change in volume. Then, a longitudinal vibration and a respiratory vibration are excited. The tubular main body 14 to which the piezoelectric vibrator 13 is fixed vibrates, and the lid portion 15 also vibrates together with the tubular main body 14. When the lid portion 15 vibrates, vibrations in various vibration modes may occur.

FIGS. 5A to 5D are schematic plan views for explaining the vibration modes in the lid portion 15. In FIGS. 5A to 5D, a white portion and a diagonally-hatched portion indicate regions being displaced in opposite phases. Therefore, a boundary between the white portion and the diagonally-hatched region becomes a node of the vibration. For example, in the vibration mode illustrated in FIG. 5B, the outer circumference A of the diagonally-hatched region becomes the node of the vibration.

Figure 5A:
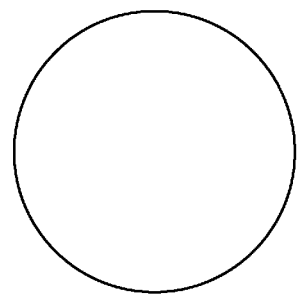
FIGS. 5A to 5D are schematic plan views for explaining a vibration mode in the lid portion.
Figure 5B:
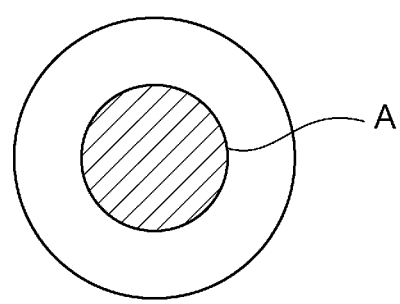
Figure 5C:
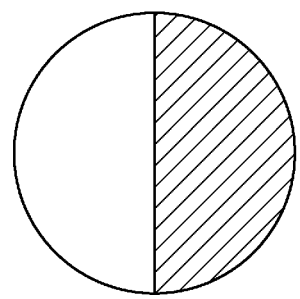
Figure 5D:
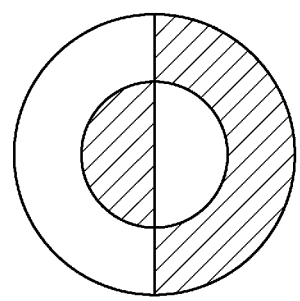

A mechanical resonant mode of a circular or substantially circular member may be expressed as (m, n). Here, m is the number of lines of nodes present in a radial direction, and n is the number of lines of nodes present in a circumferential direction. Note that, m and n are each an integer. Therefore, a vibration mode illustrated in FIG. 5A is a (0, 0) mode, FIG. 5B illustrates a (1, 0) mode, FIG. 5C illustrates a (0, 1)

mode, and FIG. 5D illustrates a (1, 1) mode. Further, a higher order vibration mode where m is 2 or more and n is 2 or more may also be used.

In the present preferred embodiment, the (0, 0) mode illustrated in FIG. 5A is used as a main vibration. That is, the piezoelectric vibrator 13 is configured such that, in the lid portion 15, the main vibration in the (0, 0) mode is strongly excited. Without departing from this configuration, there is no particular limitation on the structure of the piezoelectric vibrator 13.

As long as the vibration in the (0, 0) mode is able to be strongly excited in the lid portion 15, the piezoelectric vibrator 13 may have a structure in which one piezoelectric element is used, or may have a structure in which three or more piezoelectric elements are laminated.

In the vibration device 11 of the present preferred embodiment, the lid portion 15, that is, the light-transmitting portion, is strongly vibrated by the main vibration. With this, water droplets or other substances adhered to the second main surface 15b of the lid portion 15 are able to be easily removed by atomization.

Figure 6:
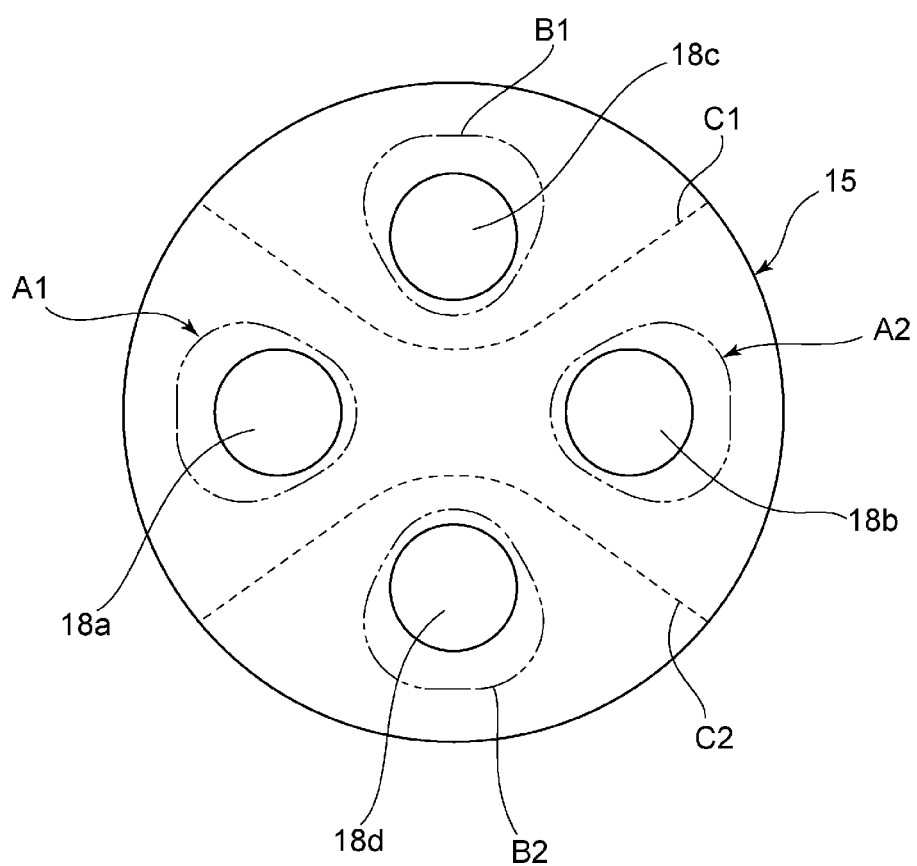
FIG. 6 is a schematic plan view for explaining a localized vibration to be excited in the first preferred embodiment of the present invention.

In addition, the lid portion 15 is preferably provided with, for example, the four recessed portions 18a to 18d, and the localized vibration portions defined by four thin portions are provided. Therefore, when the piezoelectric vibrator 13 is driven, since the thin portions are provided, the localized vibration in which the entire lid portion 15 does not uniformly vibrate is generated. FIG. 6 is a schematic plan view for explaining the localized vibration. In FIG. 6, when regions indicated by alternate long and short dash lines A1 and A2 protrude to the outer side portion of the second main surface 15b, regions indicated by alternate long and short dash lines B1 and B2 inversely protrude to an outer side portion of the first main surface 15a. That is, the portions at which the recessed portions 18a to 18d are provided are alternately displaced so as to protrude to one side and the other side in the thickness direction. The recessed portions 18a and 18b and the recessed portions 18c and 18d are displaced in opposite phases. Thus, the portions indicated by broken lines C1 and C2 become nodes of vibration.

In such a localized vibration, since the plurality of localized vibration portions are provided, the entire lid portion is not uniformly displaced. Therefore, the vibration is referred to as the localized vibration.

Figure 7:
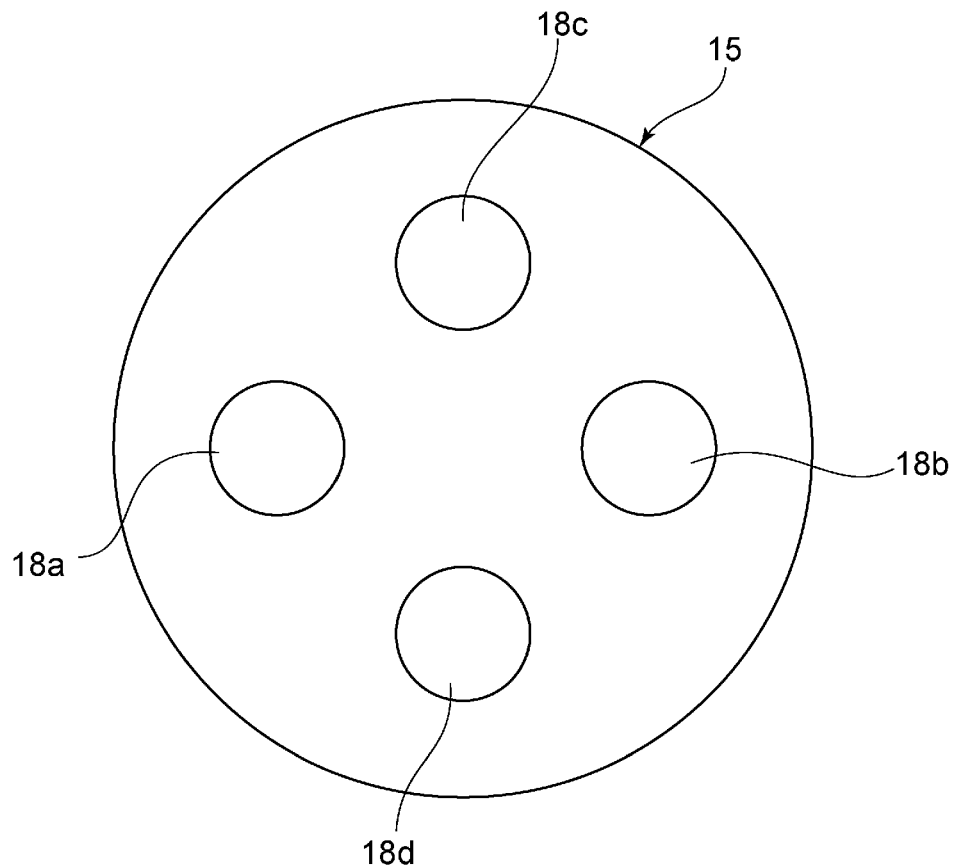
FIG. 7 is a schematic plan view for explaining a main vibration mode excited in the vibration device according to the first preferred embodiment of the present invention.

FIG. 7 is a schematic plan view for explaining the main vibration. In this case, the entire lid portion 15 is uniformly displaced.

As illustrated in FIG. 1, a driver 25 is connected to the piezoelectric vibrator 13 with a driving frequency converter 26 interposed therebetween. The driver 25 outputs an alternating current signal to drive the piezoelectric vibrator 13. The driving frequency converter 26 changes a frequency of the driving signal.

Figure 8:
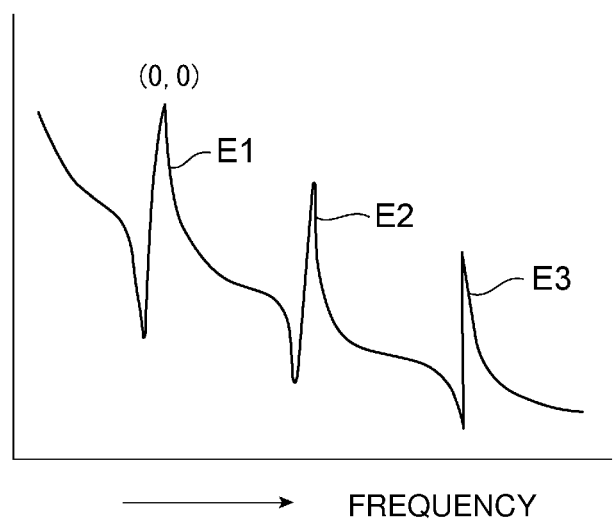
FIG. 8 is a diagram illustrating a relationship between a frequency of a driving signal and a response of the vibration mode excited in the vibration device according to the first preferred embodiment of the present invention.

Using the driver 25 and the driving frequency converter described above, an alternating current signal having a predetermined frequency is applied to the piezoelectric vibrator 13. As a result, as described above, the lid portion 15 vibrates. FIG. 8 is a schematic diagram illustrating a relationship between the frequency of the driving signal and a response of the vibration mode to be excited. In the diagram, E1 indicates the response of the vibration in the (0, 0) mode and E2 and E3 each indicate the response of the localized vibration.

Accordingly, by converting the driving frequency by the driving frequency converter, the main vibration mode and the localized vibration mode described above are able to be strongly excited.

Figure 9:
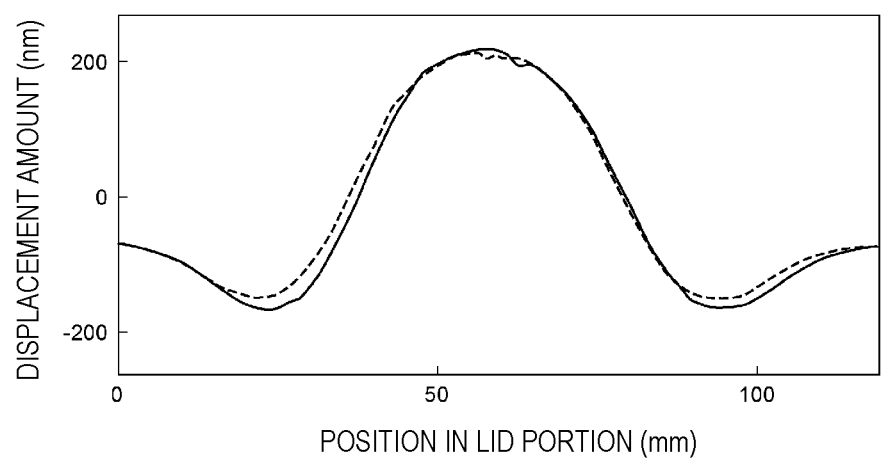
FIG. 9 is a diagram illustrating a displacement distribution of a localized vibration mode excited in the vibration device according to the first preferred embodiment of the present invention.

FIG. 9 is a diagram illustrating a relationship between the position in the lid portion vibrating in the localized vibration mode indicated by E3 and a displacement amount, that is, a displacement distribution. Note that, in FIG. 9 and FIG. 10 to be described later, the position in the lid portion on the horizontal axis indicates a position in the lid portion 15 along a diameter when one end in the diameter direction is assumed to be 0 (mm). The displacement amount is assumed to be 0 (mm) in the stationary state, and is a positive value when displaced upward and a negative value when displaced downward. As is apparent from FIG. 9, the center of the lid portion 15 is largely displaced. It is to be noted that, the lid portion 15 vibrates between a state illustrated in FIG. 9 and an inverted state thereof.

Figure 10:
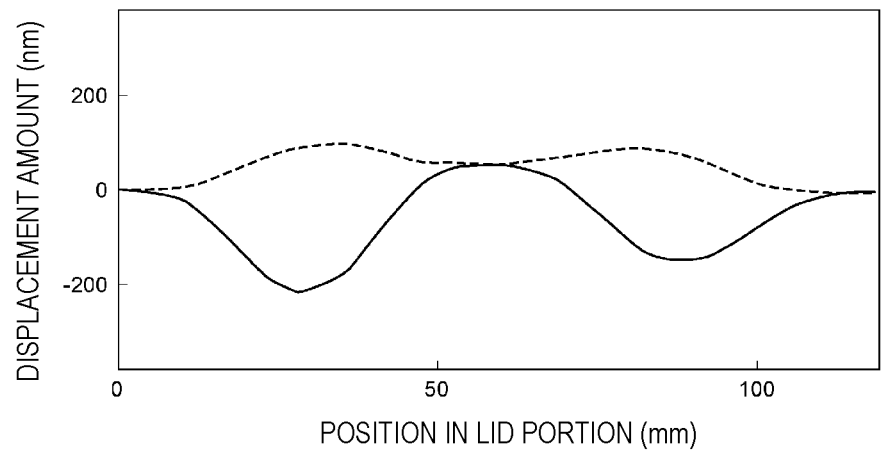
FIG. 10 is a diagram illustrating a displacement distribution of the localized vibration mode excited in the vibration device according to the first preferred embodiment of the present invention.

FIG. 10 is a diagram illustrating a relationship between the position in the lid portion vibrating in the localized vibration mode indicated by E2 and a displacement amount. The lid portion 15 vibrates between a displacement state indicated by a solid line and a displacement state indicated by a broken line in FIG. 10.

When the water droplets adhere to the second main surface 15b of the lid portion 15, the central region is able to be largely displaced by vibrating in the (0, 0) mode, that is, in the main vibration mode. Therefore, the water droplets adhered to the central region are able to be removed by atomization. In addition, when small water droplets adhere, the small water droplets are able to be desorbed and changed into relatively large water droplets. It is also possible to remove the relatively large water droplets by atomizing.

On the other hand, the vibration in the (0, 0) mode alone, may not remove all of the water droplets. To the contrary, in the localized vibration mode illustrated in FIG. 9 and FIG. 10, although the amplitude is smaller than that of the main vibration mode, the vibration is localized. Thus, it is possible to move the water droplets which have adhered by vibrating in this vibration mode from the center or approximate center to an outer side portion. That is, by alternately exciting the main vibration mode and the localized vibration mode, it is possible to perform removal of the water droplets adhered to the center or approximate center by atomizing and coalescence of the small water droplets, and movement of the water droplets that cannot be atomized to the outer side portion. Then, the water droplets which have moved to the outer side portion are able to also be removed by atomization on the outer side portion.

The reason why the water droplets that have adhered are able to be moved to the peripheral portion in the localized vibration described above is that the localized vibration portion is provided as described above. However, when the localized vibration portion overlaps with the center or approximate center of the lid portion 15, that is, the center or approximate center of the light-transmitting portion, the water droplets cannot move to the peripheral portion. In other words, in order to achieve the movement of the water droplets to the outer periphery, it is preferable that the localized vibration portion be provided at a position not overlapping with the center or approximate center of the lid portion 15, that is, the center or approximate center of the light-transmitting portion which is the center or approximate center of the field of view of the imaging element.

Figure 11:
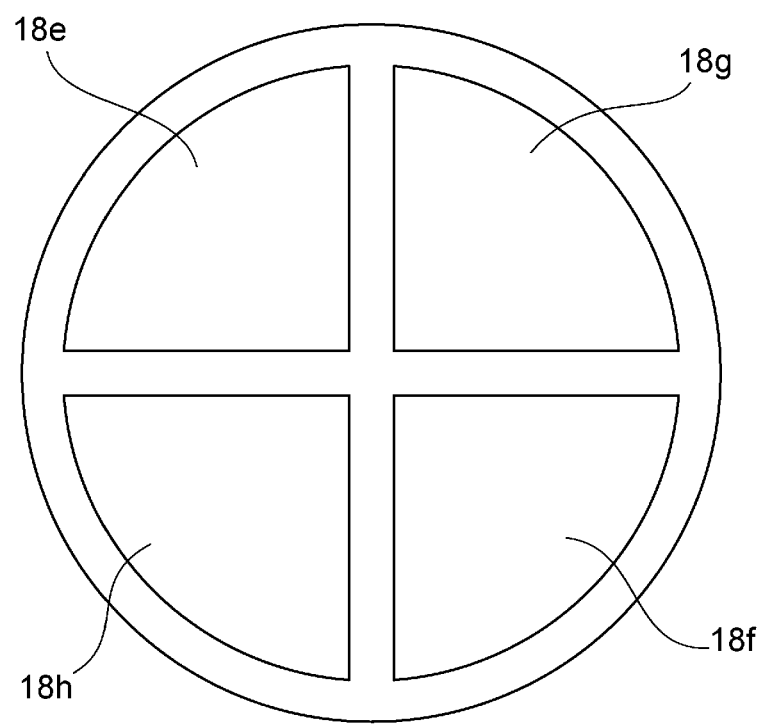
FIG. 11 is a schematic plan view for explaining the localized vibration portion according to a variation on the first preferred embodiment of the present invention.

FIG. 11 is a schematic plan view for explaining the localized vibration portion according to a variation on the first preferred embodiment of the present invention.

In the above-described preferred embodiment, the localized vibration portion defined by the thin portion is provided by each of the recessed portions 18a to 18d having a circular or substantially circular planar shape. The planar shape of the recessed portion or the thin portion is not limited thereto. As illustrated in FIG. 11, fan-shaped recessed portions 18e to 18h may be provided, and the localized vibration portions defined by the fan-shaped thin portions may be provided.

In addition, the number of the localized vibration portions is not particularly limited. The number thereof is not limited to four, other numbers of the localized vibration portions may be provided. Preferably, the number of the localized vibration portions is an even number. In this case, it is possible to equalize the numbers of the localized vibration portions which vibrate in opposite phases.

More preferably, the number of the localized vibration portions is, for example, two or four, and still more preferably, is four as in the first preferred embodiment. In this case, it is easy and preferable to displace two localized vibration portions and the other two localized vibration portions in opposite phases.

Additionally, the localized vibration portion preferably has, for example, a circular or substantially circular planar shape. In this case, the localized vibration mode is not significantly dispersed. Thus, the amplitude of the localized vibration mode is able to be increased.

Further, it is preferable that the depth of each of the recessed portions 18a to 18d and 18e to 18h defining the localized vibration portion are within a range of, for example, about 25% or more and about 75% or less of the thickness of the lid portion 15 including the light-transmitting portion. If the depth is about 25% or more of the thickness, the localized vibration portion which sufficiently excites the localized vibration is more reliably provided. If the depth is about 75% or less of the thickness, sufficient strength is able to be imparted to the light-transmitting portion even if the recessed portion is provided in the light-transmitting portion.

In the first preferred embodiment, the second disk-shaped plate 18 is bonded to the first disk-shaped plate 17, but the lid portion 15 may include one disk-shaped plate having a recessed portion on one surface. For example, a recessed portion may be provided in a plate-shaped light-transmitting member by pressing.

Figure 12:
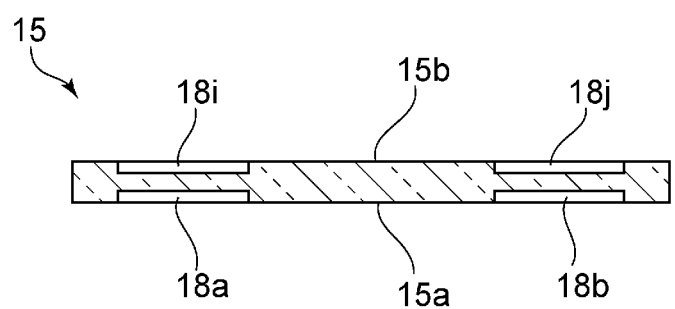
FIG. 12 is a front cross-sectional view for explaining a second variation on the localized vibration portion of the vibration device according to the first preferred embodiment of the present invention.
Figure 13:
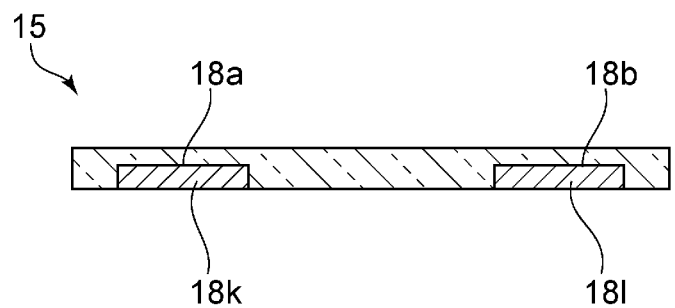
FIG. 13 is a front cross-sectional view for explaining a third variation on the localized vibration portion of the vibration device according to the first preferred embodiment of the present invention.
Figure 14:
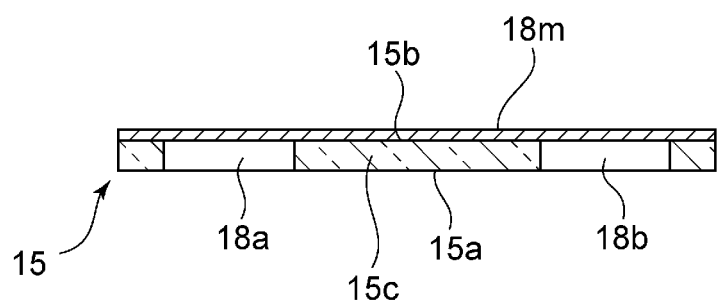
FIG. 14 is a front cross-sectional view for explaining a fourth variation on the localized vibration portion of the vibration device according to the first preferred embodiment of the present invention.

FIG. 12 to FIG. 14 are front cross-sectional views for explaining second to fourth variations on the localized vibration portions, respectively.

As illustrated in FIG. 12, in the lid portion 15, the recessed portions 18a and 18b, and recessed portions 18i and 18j may be provided on the first main surface 15a and the second main surface 15b, respectively.

Further, as illustrated in FIG. 13, material layers 18k and 18l different from the material of the lid portion 15 may be provided in the recessed portions 18a and 18b. Further, the different material layers 18k and 18l may be bonded to at least one of the first main surface 15a and the second main surface 15b of the lid portion 15 without providing the recessed portions 18a and 18b.

Further, as illustrated in FIG. 14, through-holes may be provided in a lid portion main body 15c preferably made of glass, for example, and a different material plate 18m may be laminated on one surface of the lid portion main body 15c. The different material plate 18m is preferably made of a material different from that of the lid portion main body 15c. The through-holes are closed by the different material plate 18m, and the recessed portions 18a and 18b are provided.

As illustrated in FIG. 11 to FIG. 14, in preferred embodiments of the present invention, the above-described structure of the localized vibration portion is not particularly limited as long as the localized vibration is able to be generated. Additionally, it is preferable that the localized vibration portion and the remaining portion of the light-transmitting portion be structured to be different from each other in at least one of a Young's modulus, a density, and a Poisson's ratio, so that the localized vibration is able to be excited with a large amplitude.

Figure 15:
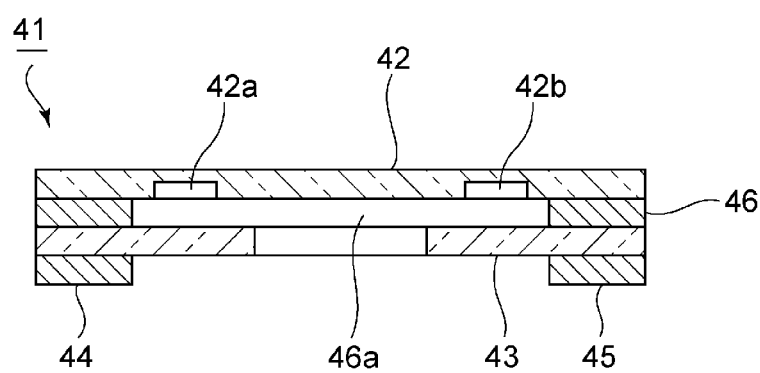
FIG. 15 is a front cross-sectional view of the localized vibration portion of the vibration device according to a second preferred embodiment of the present invention.

FIG. 15 is a front cross-sectional view for explaining the localized vibration portion of the vibration device according to a second preferred embodiment of the present invention. A vibration device 41 according to the second preferred embodiment includes first and second light-transmitting plates 42 and 43. The first and second light-transmitting plates 42 and 43 are preferably made of transparent synthetic resin, glass, or other suitable materials, for example. Recessed portions 42a and 42b are provided on an inner side surface of the second light-transmitting plate 42. With this configuration, the thin portions are provided, and the localized vibration portions are configured.

Piezoelectric vibration elements 44 and 45 are fixed on an outer side surface of the second light-transmitting plate 43. Further, the first and second light-transmitting plates 42 and 43 are bonded with a support plate 46 interposed therebetween. The support plate 46 includes a cavity 46a. Accordingly, the first and second light-transmitting plates 42 and 43 oppose each other with the cavity 46a provided therebetween.

In the present preferred embodiment, the center or approximate center of each of the first and second light-transmitting plates 42 and 43 defines the light-transmitting portion. Then, the outer peripheral edge portion of each of the first and second light-transmitting plates 42 and 43 defines a portion of the vibration body, and the piezoelectric vibrators 44 and 45 are fixed to the vibration body portion. As described above, the center or approximate center portion of the member on the plate may define the light-transmitting portion and the outer side portion thereof may be define the vibration body. Additionally, as in the present preferred embodiment, a buckling piezoelectric vibrator may be used.

Figure 16:
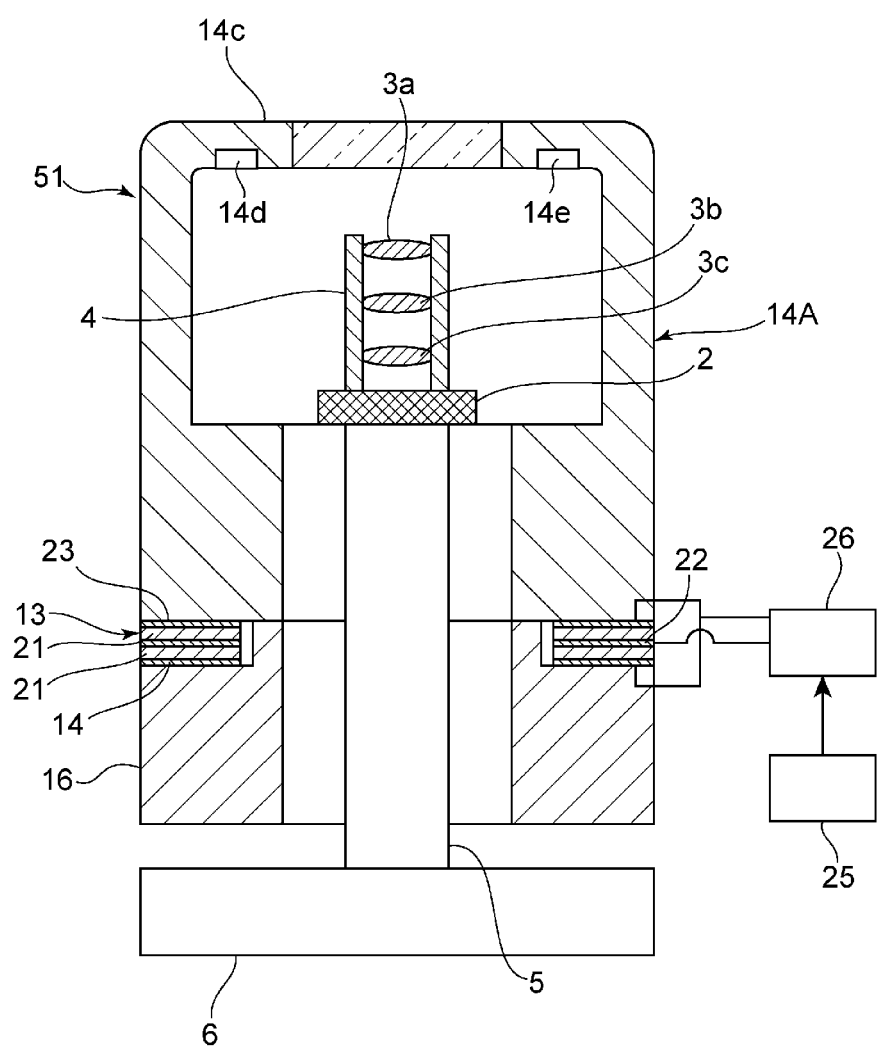
FIG. 16 is a front cross-sectional view of the vibration device according to a third preferred embodiment of the present invention.

FIG. 16 is a front cross-sectional view of the vibration device according to a third preferred embodiment of the present invention.

In a vibration device 51, the light-transmitting plate defining the light-transmitting portion is fitted into a tip opening of a tubular main body 14A defining the vibration portion. Here, an upper end of the tubular main body 14A preferably has, for example, a doughnut-shaped portion 14c that extends inwardly. Recessed portions 14d and 14e are provided on an inner surface of the doughnut-shaped portion 14c to define the localized vibration portion. That is, although the light-transmitting plate defines the light-transmitting portion, the localized vibration portion is provided in the doughnut-shaped portion 14c in an outer side portion of the light-transmitting portion. As described above, the localized vibration portion may be provided in the vibration portion as long as it does not overlap with the center of the light-transmitting portion. In other words, the localized vibration portion may be provided at a position other than the light-transmitting portion.

Figure 17:
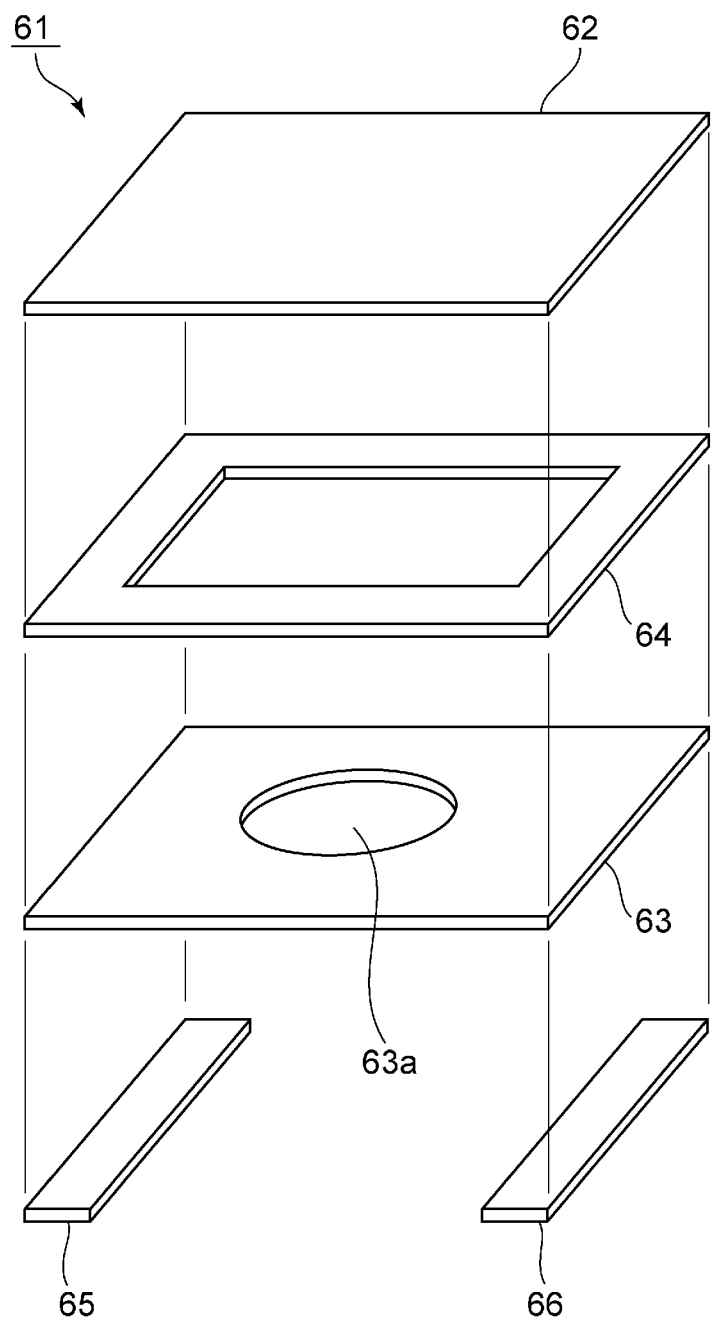
FIG. 17 is an exploded perspective view of the vibration device according to a fourth preferred embodiment of the present invention.

FIG. 17 is an exploded perspective view of the vibration device according to a fourth preferred embodiment of the present invention. A vibration device 61 includes a light-transmitting plate 62 and a rectangular or substantially rectangular plate 63. An opening 63a is provided in the center or approximate center of the rectangular plate 63. The light-transmitting plate 62 and the rectangular plate 63 are bonded with a rectangular or substantially rectangular frame-shaped support body 64 interposed therebetween.

Piezoelectric vibrators 65 and 66 are bonded to a lower surface of the rectangular or substantially rectangular plate 63.

Figure 18:
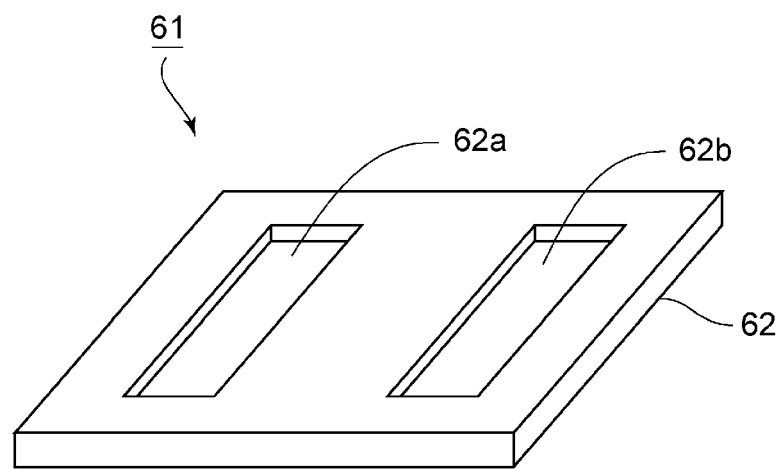
FIG. 18 is a perspective view for explaining the localized vibration portion of the vibration device according to the fourth preferred embodiment of the present invention.

As illustrated in FIG. 18, in the vibration device 61, the localized vibration portion is defined by recessed portions 62a and 62b on a lower surface of the light-transmitting plate 62. As described above, the vibration device according to the present preferred embodiment may preferably have a rectangular or substantially rectangular plate shape as a whole, and the recessed portion defining the localized vibration portion may also preferably have an arbitrary shape, such as a rectangle or a substantial rectangle, for example.

Figure 19:
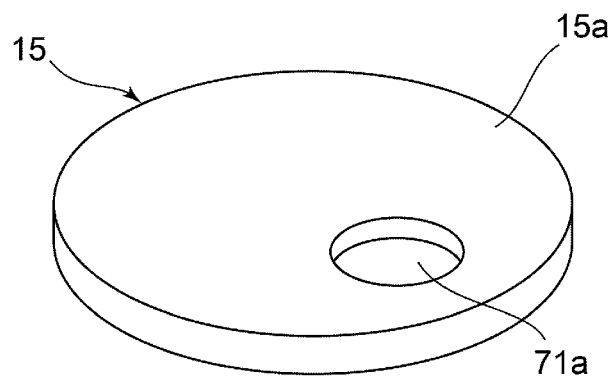
FIG. 19 is a perspective view for explaining a fifth variation on the localized vibration portion of the vibration device according to the first preferred embodiment of the present invention.

FIG. 19 is a perspective view for explaining a fifth variation on the localized vibration portion of the vibration device according to the first preferred embodiment. In the fifth variation illustrated in FIG. 19, a single recessed portion 71a is provided on the first main surface 15a of the lid portion 15. As described above, a single localized vibration portion may be defined by the single recessed portion 71a.

Figure 20:
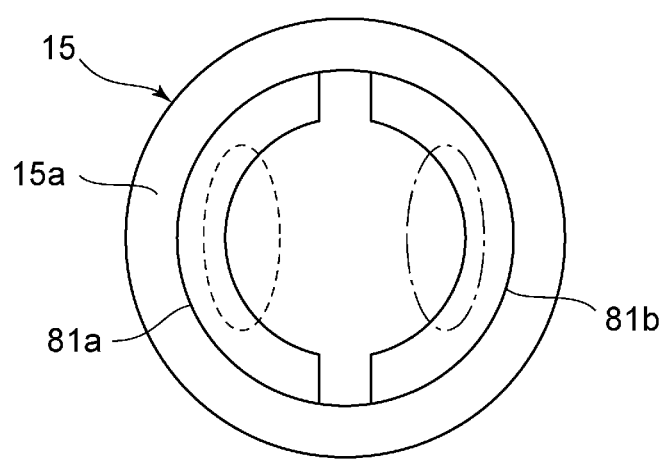
FIG. 20 is a plan view for explaining a sixth variation on the localized vibration portion of the vibration device according to the first preferred embodiment of the present invention.

FIG. 20 is a plan view for explaining a sixth variation on the localized vibration portion of the vibration device according to the first preferred embodiment. Here, a pair of recessed portions 81a and 81b are provided on the first main surface 15a of the lid portion 15. The recessed portion 81a preferably has a shape in which an arc of an inner second circle having a different radius is connected at both ends. The central angle of this arc is preferably set to approximately 180°, for example. In this case, when the lid portion 15 vibrates, a portion on the side of the recessed portion 81a indicated by a broken line and a portion on the side of the recessed portion 81b indicated by an alternate long and short dash line become portions that are vibrated in opposite phases. Accordingly, the water droplets or other substances are able to be efficiently moved to the outer side portion from the center or approximate center of the lid portion 15.

Figure 21:
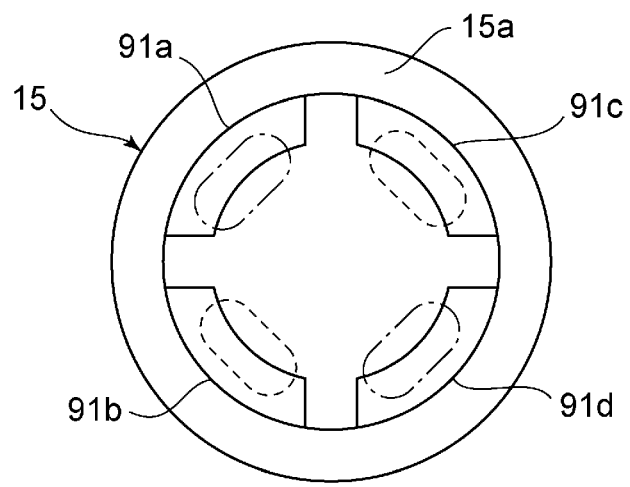
FIG. 21 is a plan view for explaining a seventh variation on the localized vibration portion of the vibration device according to the first preferred embodiment of the present invention.

FIG. 21 is a plan view for explaining a seventh variation on the localized vibration portion of the vibration device according to the first preferred embodiment. As illustrated in FIG. 21, four recessed portions 91a to 91d may be provided on the first main surface 15a of the lid portion 15. The recessed portions 91a and 91b correspond to shapes obtained by dividing the recessed portion 81a illustrated in FIG. 20. The recessed portions 91c and 91d correspond to shapes obtained by dividing the recessed portion 81b illustrated in FIG. 20 at the center or approximate center. In this case, the recessed portion 91a and the recessed portion 91d oppose each other with the center or approximate center of the lid portion 15 therebetween. The recessed portion 91b and the recessed portion 91c oppose each other with the center or approximate center of the lid portion 15 therebetween. Accordingly, when the lid portion 15 vibrates, a portion indicated by a broken line of the recessed portions 91b and 91c and a portion surrounded by an alternate long and short dash line of the recessed portions 91a and 91d are strongly vibrated in opposite phases. Therefore, the water droplets adhering to the center or approximate center of the lid portion 15 are able to be efficiently moved to the outer peripheral side of the lid portion 15.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
    a vibration body including a light-transmitting portion including first and second main surfaces opposing each other and a vibration portion that is continuous with the light-transmitting portion and vibrates with a main vibration together with the light-transmitting portion; and
    a piezoelectric vibrator fixed to the vibration portion; wherein
    a plurality of localized vibration portions that generate a localized vibration different from the main vibration, are provided at a position not overlapping with a center or approximate center of the light-transmitting portion.

2. The vibration device according to claim 1, wherein the piezoelectric vibrator is fixed to the vibration portion of the vibration body such that the main vibration and the localized vibration are excited.

3. The vibration device according to claim 1, wherein the localized vibration portion is provided in the light-transmitting portion and is different in at least one of a Young's modulus, a density, and a Poisson's ratio from a remaining portion of the light-transmitting portion.

4. The vibration device according to claim 1, wherein the localized vibration portion is provided in the light-transmitting portion and is a thin portion having a thickness smaller than a thickness of a remaining portion of the light-transmitting portion.

5. The vibration device according to claim 4, wherein at least one of the first and second main surfaces of the light-transmitting portion is provided with a recessed portion in the thin portion.

6. The vibration device according to claim 5, wherein the recessed portion is provided on the first main surface.

7. The vibration device according to claim 1, wherein the localized vibration portion includes a portion made of a material different from a material of a remaining portion of the light-transmitting portion.

8. The vibration device according to claim 1, wherein the localized vibration portion is provided in the vibration portion.

9. The vibration device according to claim 1, wherein the localized vibration portion has a circular or substantially circular planar shape.

10. The vibration device according to claim 1, wherein a number of the localized vibration portions is an even number.

11. The vibration device according to claim 1, wherein the vibration body includes a tubular main body and a lid portion that closes an opening of the tubular main body, and the light-transmitting portion is provided in the lid portion.

12. The vibration device according to claim 1, wherein the vibration body has a rectangular or substantially rectangular plate shape.

13. The vibration device according to claim 1, further including a driver that drives the piezoelectric vibrator.

14. The vibration device according to claim 13, further including a driving frequency changer that changes a frequency of a driving signal of the piezoelectric vibrator.

15. An imaging device comprising:
    the vibration device according to claim 1; and
    an imaging element opposing the first main surface to shoot an outside of the second main surface of the vibration body of the vibration device.

16. The imaging device according to claim 15, wherein the localized vibration portion is positioned outside a field of view of the imaging element.

17. The imaging device according to claim 15, wherein the piezoelectric vibrator is fixed to the vibration portion of the vibration body such that the main vibration and the localized vibration are excited.

18. The imaging device according to claim 15, wherein the localized vibration portion is provided in the light-transmitting portion and is different in at least one of a Young's modulus, a density, and a Poisson's ratio from a remaining portion of the light-transmitting portion.

19. The imaging device according to claim 15, wherein the localized vibration portion is provided in the light-transmitting portion and is a thin portion having a thickness smaller than a thickness of a remaining portion of the light-transmitting portion.

20. The imaging device according to claim 19, wherein at least one of the first and second main surfaces of the light-transmitting portion is provided with a recessed portion in the thin portion.

\* \* \* \* \*